United States Patent [19]
Saunier et al.

[11] Patent Number: 5,300,795
[45] Date of Patent: Apr. 5, 1994

[54] GAAS FET WITH RESISTIVE ALGAAS

[75] Inventors: Paul Saunier, Garland; Hua Q. Tserng, Dallas, both of Tex.

[73] Assignee: Texas Instruments Incorporated, Dallas, Tex.

[21] Appl. No.: 854,169

[22] Filed: Mar. 20, 1992

Related U.S. Application Data

[62] Division of Ser. No. 648,091, Jan. 31, 1991, abandoned.

[51] Int. Cl.$^5$ .................. H01L 29/80; H01L 29/161; H01L 21/265; H01L 21/44
[52] U.S. Cl. .................. 257/192; 257/280; 257/288; 257/471; 257/622; 437/38; 437/133; 437/176; 437/203
[58] Field of Search ............ 357/22, 23.2, 15, 16, 357/55; 437/38, 39, 40, 126, 133, 176, 203, 225; 257/192, 194, 213, 280, 284, 288, 289, 471, 622

[56] References Cited

U.S. PATENT DOCUMENTS

| | | | |
|---|---|---|---|
| 4,424,525 | 1/1984 | Mimura | 357/23 |
| 4,641,161 | 2/1987 | Kim et al. | 357/22 |
| 4,987,462 | 1/1991 | Kim et al. | 357/22 |
| 5,091,759 | 2/1992 | Shih et al. | 257/194 |

OTHER PUBLICATIONS

IEEE Electron Device Letters, vol. 7, #11, pp. 638-639 by Kim et al. Nov. 1986.
IEEE Electron Device Letters, vol. 5, #11 pp. 494-495 by Kim et al. Nov. 1984.

*Primary Examiner*—Mark V. Prenty
*Attorney, Agent, or Firm*—Dana L. Burton; Richard A. Stoltz; James C. Kesterson

[57] ABSTRACT

This is a FET device and the device comprises: a buffer layer 30; a channel layer 32 of doped narrow bandgap material over the buffer layer; and a resistive layer 34 of low doped wide bandgap material over the channel layer, the doping of the channel layer and the resistive layer being such that no significant transfer of electrons occurs between the resistive layer and the channel layer. This is also a method of making a FET device.

14 Claims, 1 Drawing Sheet

GAAS FET WITH RESISTIVE ALGAAS

This is a division, of application Ser. No. 07/648,091, filed Jan. 31, 1991, and now abandoned.

NOTICE (C) Copyright, *M* Texas Instruments Incorporated 1991. A portion of the disclosure of this patent document contains material which is subject to copyright and mask work protection. The copyright and mask work owner has no objection to the facsimile reproduction by anyone of the patent document or the patent disclosure, as it appears in the Patent and Trademark Office patent file or records, but otherwise reserves all copyright and mask work rights whatsoever.

FIELD OF THE INVENTION

This invention generally relates to semiconductor fabrication methods and devices, and more specifically to microwave semiconductor methods and devices, such as high-power, high-frequency microwave devices.

BACKGROUND OF THE INVENTION

A popular microwave transistor technology is MESFET technology. A common feature of this technology is that a Schottky barrier metal is used as the gate. The channel will typically be a doped GaAs semiconductor layer which overlies a semi-insulating substrate. Leakage along the surface from gate to drain is a common problem, and since reduction of series resistance in the channel is also highly desirable, the gate is commonly recessed. That is, the gate Schottky-barrier metallization is not deposited directly on the top surface of the semiconductor, but a recess is etched before the gate is deposited. This means that the electron population in the channel is slightly removed from the adverse effects of the surface states normally found at the semiconductor surface, and also means that the surface leakage path from gate to drain is longer. This technology suffers from: several very important limitations. The output power capability of a MESFET is limited by the gate-drain breakdown voltage and the conduction current through the channel. To improve the breakdown voltage, either a low carrier concentration buffer layer between the gate metal and the channel, or a graded channel approach can be used. By employing either an insulating or a semi-insulating buffer layer, the breakdown voltage can be greatly increased, due to the much higher breakdown field of the layer, while the current level is maintained. This should result in a device with improved output power. Unfortunately, it has proven difficult to fabricate metal-insulator-semiconductor or insulated gate FET from III-V compound semiconductors. This is largely due to the large lattice mismatch at the insulator interface and the difficulty in growing a good oxide layer.

There are FETs with GaAs (which is low doped or undoped) and highly doped AlGaAs, referred to (among other names) as HEMTs. The HEMT device structure has a GaAs channel layer which is either undoped or very lightly doped, under a doped AlGaAs layer. This provides very high channel mobilities, but results in very low current levels and high parasitic resistances. These devices were primarily intended for low voltage operation. HEMT devices are extremely sensitive to the quality of the interface between the GaAs and AlGaAs layers. In a HEMT structure, the active carrier population is very narrowly confined to a shallow layer underneath this heterojunction. This means that any degradation in the quality of this interface will drastically degrade the device characteristics.

A type of MISFET, using an undoped AlGaAs layer as an insulator over an n-type GaAs channel, has shown to be more applicable for microwave uses. The high breakdown field of the wide bandgap AlGaAs results in a very high gate breakdown voltage and a low pre-breakdown gate leakage current. The presence of the gate insulator also reduces the gate capacitance. Moreover, the electron density in the channel is not all concentrated next to the heterojunction, which means that the series resistance of the channel is low, and also means that channel mobility will not be degraded by a less-than-perfect interface at the heterojunction.

SUMMARY OF THE INVENTION

This is a FET device. The device comprises: a buffer layer; a channel layer of doped narrow bandgap material over the buffer layer; and a resistive layer of low doped wide bandgap material over the channel layer, the doping of the channel layer and the resistive layer being such that no significant transfer of electrons occurs between the resistive layer and the channel layer.

Preferably, a highly doped cap layer is over a portion of the resistive layer, the gate is in a recess in the resistive layer, the buffer layer is undoped GaAs, the channel layer is doped GaAs, the resistive layer is low doped $Al_yGa_{1-y}As$ where y is between 0.2 and 0.33, and the AlGaAs under the source/drain contacts are not ion implanted.

This is also a method of making a FET device. The method comprises: forming a buffer layer; forming a channel layer of doped narrow bandgap material over the buffer layer; forming a resistive layer of low doped wide bandgap material over the channel layer, the doping of the channel layer and the resistive layer being such that no significant transfer of electrons occurs between the resistive layer and the channel layer.

DETAILED DESCRIPTION OF PREFERRED EMBODIMENTS

Figure 1:
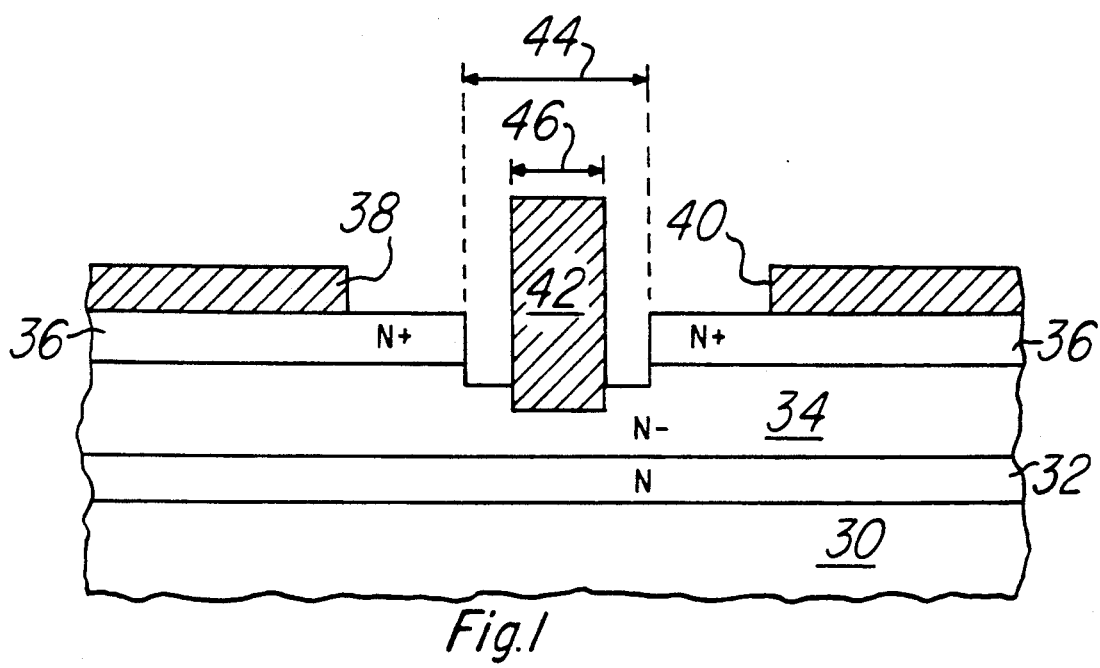
FIG. 1 is a cross-section of a preferred embodiment of this invention.

A preferred embodiment of the present invention is shown in FIG. 1. The device is on a buffer layer 30, which preferably is GaAs, AlGaAs or a superlattice of GaAs/AlAs (for better electron confinement). A layer 32 of at least moderately highly n doped GaAs, typically doped to $3 \times 10^{17}$ cm$^{-3}$ and 750 Å thick, is epitaxially grown over the buffer layer 30 by a process such as molecular beam epitaxy (MBE). This layer 32 forms the channel of the transistor in the finished device. An n-resistive layer 34 of low doped (typically $5 \times 10^{16}$ to $1 \times 10^{17}$ cm$^{-3}$) $Al_yGa_{1-y}As$, where y, the Al mole fraction, is preferably 0.3 but may range from 0.2 to 0.33, is epitaxially grown, preferably by MBE, to a thickness of 2000-2500 Å over the channel layer 32. This level of aluminum and of doping provides AlGaAs which is resistive, rather than generally insulating, thus this is not a MISFET type device. An n+ GaAs cap layer 36, approximately 1000 Å thick is formed, by a process such as MBE, over the AlGaAs layer 34. The function of the cap layer 36 is to facilitate alloyed contacts of the source 38 and drain 40. A recess may be formed to improve performance This recess may be either a single or a double recess. In this embodiment, a double recess is preferred. Ideally, the wide recess 44 is approximately 1.5 μm wide and 1900 Å deep, and the gate recess 46 is approximately 0.5 μm wide and an additional 800 Å deep. The gate 42 is formed in this recess, leaving approximately 800 Å of low doped AlGaAs under the gate.

The source 38 and drain 40 contacts are formed over the cap layer 36. They are preferably layered AuGe/Ni/Au and are alloyed at 450° C. for 3 minutes. The gate is preferably a Schottky barrier contact of layered Ti/Pt/Au at thicknesses of approximately 1500 Å, 500 Å, and 4000 Å, respectively.

The dimensions given in this embodiment are for use in X-band operation and may be adjusted for higher frequency operation. For example, if higher frequency operation were desired, the wide and gate recess dimensions would be decreased, the thickness of the AlGaAs under the gate would be decreased, the channel thickness would be decreased, and the doping levels would be increased. Millimeter wave operation can be achieved by making changes such as those cited above.

The device in this embodiment provides significant performance and better ohmic contact than previous devices. The doping of the AlGaAs layer 34 is done to a level high enough to provide good ohmic contact of the source 38 and drain 40 but not so high as to allow significant transfer of electrons between it and the channel layer 32 (as seen in the HEMT). The concentration of Al in the AlGaAs layer is chosen to improve ohmic contact of the source 38 and drain 40, and to still maintain the performance improvements, realized by the increased resistivity, due to the addition of Al to GaAs. The double recess, by changing the field, increases the breakdown voltage, thus making the device better for higher power applications. A breakdown voltage of approximately 22-27 volts has been achieved with this device (as compared to the 13-15 volts of prior devices). Some other performance characteristics of this device include higher operating voltage (12-14 volts compared to 7-8 volts in prior devices), better efficiency (60% as compared to 45% in prior devices), better pinch-off, and higher cutoff frequency.

Prior GaAs devices have used ion implanted regions in the AlGaAs under the source/drain contacts. The device of this invention is also unusual in that it generally operates better without such implanted regions.

A preferred embodiment has been described in detail hereinabove. It is to be understood that the scope of the invention also comprehends embodiments different from those described, yet within the scope of the claims. For example, the AlGaAs layer 34 could be any appropriate low doped, wide bandgap material(i.e superlattice), and the GaAs channel layer 32 could be a material such as InGaAs. Similarly, instead of MBE, a process such as metalorganic chemical vapor deposition (MOCVD) could be used.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor device, said device comprising:
   a. a buffer layer;
   b. a channel layer of doped narrow bandgap material, having a thickness greater than 250 Å, over said buffer layer;
   c. a resistive layer of wide bandgap material, with a dopant concentration of $10^{16}$ cm$^3$ or greater, over said channel layer; and
   d. a gate in a double stepped recess in said resistive layer.

2. The device of claim 1, wherein a highly doped cap layer is over a portion of said resistive layer.

3. The device of claim 1, wherein said buffer layer is undoped GaAs.

4. The device of claim 1, wherein said channel layer is doped GaAs.

5. The device of claim 1, wherein said resistive layer is lowly doped Al$_y$Ga$_{1-y}$As, where y is between 0.20 and 0.33.

6. The device of claim 1, wherein source/drain contacts are directly or indirectly over portions of said resistive layer.

7. The device of claim 6, wherein regions of said resistive layer under said source/drain contacts are not ion implanted.

8. The device of claim 2, wherein source/drain contacts are over at least a portion of said highly doped cap layer.

9. A method of making a semiconductor device, said method comprising:
   a. forming a buffer layer;
   b. forming a channel layer of doped narrow bandgap material, having a thickness greater than 250 Å, over said buffer layer;
   c. forming a resistive layer of wide bandgap material, with a dopant concentration of $10^{16}$ cm$^3$ or greater, over said channel layer; and
   d. forming a double stepped recess in said resistive layer in which a gate is formed.

10. The method of claim 9, wherein a highly doped cap layer is formed over a portion of said resistive layer.

11. The method of claim 9, wherein said buffer layer is undoped GaAs.

12. The method of claim 9, wherein said channel layer is doped GaAs.

13. The method of claim 9, wherein said resistive layer is lowly doped Al$_y$Ga$_{1-y}$As, where y is between 0.20 and 0.33.

14. The method of claim 9, wherein source/drain contacts are formed over portions of said resistive layer.

* * * * *

UNITED STATES PATENT AND TRADEMARK OFFICE
CERTIFICATE OF CORRECTION

PATENT NO. : 5,300,795
DATED : Apr. 5, 1994
INVENTOR(S) : Paul Saunier, Hua Q. Tserng It is certified that error appears in the above-indentified patent and that said Letters Patent is hereby corrected as shown below:

Column 4, line 17 of Claim 1, "$10^{16}cm^3$" should instead be -- $10^{16}cm^{-3}$ --.

Column 4, line 46 of Claim 9, "$10^{16}cm^3$" should instead be -- $10^{16}cm^{-3}$ --.

Signed and Sealed this

Third Day of June, 1997

Attest:

BRUCE LEHMAN

*Attesting Officer*   Commissioner of Patents and Trademarks